United States Patent
Adusumilli et al.

(10) Patent No.: US 11,164,867 B2
(45) Date of Patent: Nov. 2, 2021

(54) FIN-TYPE FIELD-EFFECT TRANSISTORS OVER ONE OR MORE BURIED POLYCRYSTALLINE LAYERS

(71) Applicant: GLOBALFOUNDRIES U.S. Inc., Santa Clara, CA (US)

(72) Inventors: Siva P. Adusumilli, South Burlington, VT (US); Julien Frougier, Albany, NY (US); Ruilong Xie, Niskayuna, NY (US); Anthony K. Stamper, Williston, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/534,361

(22) Filed: Aug. 7, 2019

(65) Prior Publication Data
US 2021/0043624 A1 Feb. 11, 2021

(51) Int. Cl.
*H01L 29/04* (2006.01)
*H01L 29/786* (2006.01)
(Continued)

(52) U.S. Cl.
CPC .... *H01L 27/0886* (2013.01); *H01L 21/26513* (2013.01); *H01L 21/324* (2013.01);
(Continued)

(58) Field of Classification Search
CPC .......................... H01L 29/04; H01L 29/78672
See application file for complete search history.

(56) References Cited

U.S. PATENT DOCUMENTS

| 4,786,608 A | 11/1988 | Griffith |
| 6,833,322 B2 | 12/2004 | Anderson et al. |

(Continued)

FOREIGN PATENT DOCUMENTS

TW 201622106 A 6/2016

OTHER PUBLICATIONS

Singh, Jagar, et al. "14-nm FinFET technology for analog and RF applications." IEEE Transactions on Electron Devices 65.1 (2017): 31-37.
(Continued)

*Primary Examiner* — Moazzam Hossain
(74) *Attorney, Agent, or Firm* — Thompson Hine LLP; Anthony Canale

(57) ABSTRACT

Structures with altered crystallinity and methods associated with forming such structures. A semiconductor layer has a first region containing polycrystalline semiconductor material, defects, and atoms of an inert gas species. Multiple fins are arranged over the first region of the semiconductor layer. The structure may be formed by implanting the semiconductor layer with inert gas ions to modify a crystal structure of the semiconductor layer in the first region and a second region between the first region and a top surface of the semiconductor layer. An annealing process is used to convert the first region of the semiconductor layer to a polycrystalline state and the second region of the semiconductor layer to a monocrystalline state. The fins are patterned from the second region of the semiconductor layer and another semiconductor layer epitaxially grown over the second region of the semiconductor layer.

19 Claims, 6 Drawing Sheets

(51) Int. Cl.
*H01L 27/088* (2006.01)
*H01L 21/265* (2006.01)
*H01L 21/8234* (2006.01)
*H01L 21/324* (2006.01)

(52) U.S. Cl.
CPC ........... *H01L 21/823431* (2013.01); *H01L 21/823493* (2013.01); *H01L 29/04* (2013.01)

(56) References Cited

U.S. PATENT DOCUMENTS

| | | |
|---|---|---|
| 8,299,537 B2 | 10/2012 | Greco et al. |
| 9,219,150 B1 | 12/2015 | Nguyen et al. |
| 10,535,523 B1 * | 1/2020 | Lin ................... H01L 21/76865 |
| 2014/0138800 A1 * | 5/2014 | He ......................... H01L 29/02 |
| | | 257/632 |
| 2017/0092498 A1 * | 3/2017 | Li ..................... H01L 21/02123 |
| 2017/0133507 A1 * | 5/2017 | Cheng .................... H01L 29/16 |
| 2017/0170182 A1 * | 6/2017 | Balakrishnan ...... H01L 29/7842 |
| 2018/0315645 A1 * | 11/2018 | Schultz ............... H01L 21/0337 |
| 2018/0342622 A1 * | 11/2018 | Zhu .................... H01L 27/1211 |
| 2019/0080910 A1 * | 3/2019 | Reznicek ............. H01L 27/092 |

OTHER PUBLICATIONS

Wambacq, Piet, et al. "The potential of FinFETs for analog and RF circuit applications." IEEE Transactions on Circuits and Systems I: Regular Papers 54.11 (2007).

Taiwan Intellectual Property Office, Examination Report dated May 7, 2021 in Taiwanese Patent Application No. 109122894.

* cited by examiner

FIN-TYPE FIELD-EFFECT TRANSISTORS OVER ONE OR MORE BURIED POLYCRYSTALLINE LAYERS

BACKGROUND

The present invention relates to semiconductor device fabrication and integrated circuits and, more specifically, to structures with altered crystallinity beneath semiconductor devices and methods associated with forming such structures.

Bulk silicon substrates are less costly than silicon-on-insulator (SOI) substrates. Generally, an SOI substrate includes a thin device layer of silicon, a handle substrate, and a thin buried oxide (BOX) layer physically separating and electrically isolating the device layer from the handle substrate. Devices fabricated using SOI technologies may exhibit certain performance improvements in comparison with comparable devices built using a bulk silicon substrate. For example, the BOX layer of an SOI substrate provides a bottom dielectric isolation that may suppress sub-channel leakage. The poor device isolation furnished by a bulk silicon substrate may lead to cross-talk between the devices in a radio-frequency (RF) operating mode.

Improved structures that provide the advantages of an SOI substrate absent the cost and methods of forming such structures are needed.

SUMMARY

In an embodiment of the invention, a structure includes a semiconductor layer having a region that contains polycrystalline semiconductor material, a plurality of defects, and atoms of an inert gas species. The structure further includes a plurality of fins over the region of the semiconductor layer.

In an embodiment of the invention, a method includes implanting a first semiconductor layer over a depth range with ions of an inert gas species to modify a crystal structure of a semiconductor material of the first semiconductor layer in a first region and a second region between the first region and a top surface of the first semiconductor layer, and annealing the first semiconductor layer with an annealing process to convert the semiconductor material within the first region of the first semiconductor layer to a polycrystalline state and the semiconductor material within the second region of the first semiconductor layer to a monocrystalline state. After annealing the first semiconductor layer, a second semiconductor layer is epitaxially grown over the second region of the first semiconductor layer, and the second semiconductor layer and the second region of the first semiconductor layer are patterned to form a plurality of fins. The first region contains a plurality of defects and atoms of the inert gas species.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
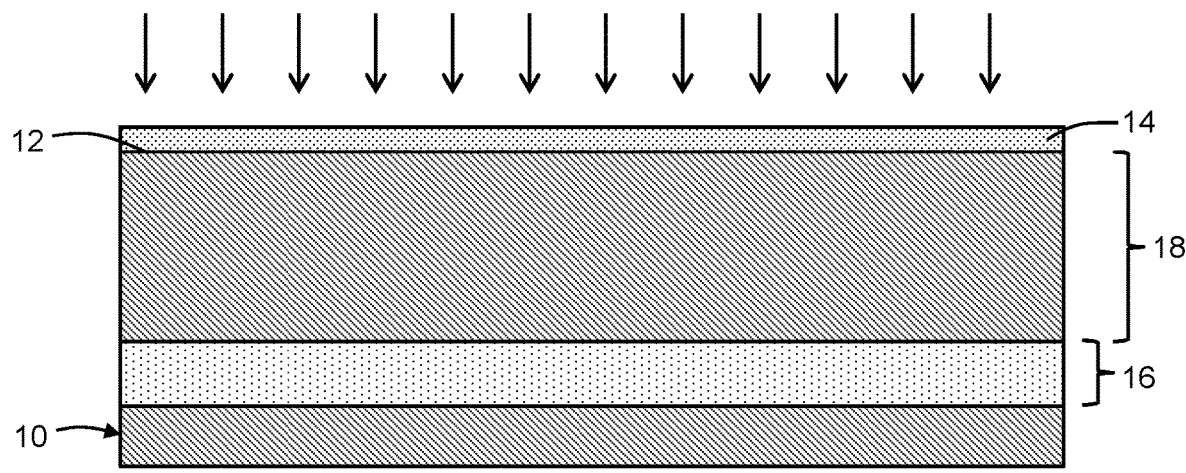
FIGS. 1-7 are cross-sectional views of a structure at successive fabrication stages of a processing method in accordance with embodiments of the invention.

With reference to FIG. 1 and in accordance with embodiments of the invention, a semiconductor layer 10 is provided that is composed of a monocrystalline or single-crystal semiconductor material, such as single-crystal silicon. The semiconductor layer 10 may be, for example, a bulk wafer composed of single-crystal semiconductor material. In an alternative embodiment, the semiconductor layer 10 may be a device layer of a silicon-on-insulator (SOI) wafer. A dielectric layer 14 may be formed on the top surface 12 of the semiconductor layer 10. The dielectric layer 14 may be composed of a dielectric material, such as silicon dioxide, deposited by chemical vapor deposition or grown by thermal oxidation.

Layers or regions 16, 18 containing modified semiconductor material are formed by ion implantation in the semiconductor layer 10 and collectively have a depth profile that extends over a given depth range within the semiconductor layer 10. The region 16 may be located within the depth profile at a given depth beneath the top surface 12 of the semiconductor layer 10, and the region 18 may be located within the depth profile between the region 16 and the top surface 12 of the semiconductor layer 10. The semiconductor layer 10 may be undamaged and single crystal at depths located beyond the depth profile of the region 16. In an embodiment, a single implantation may be performed to provide the regions 16, 18.

The region 16 contains a concentration of an inert gas species introduced by the implanted ions and also contains damage to the single-crystal semiconductor material of the semiconductor layer 10 caused by the implantation. The distribution of the implanted inert gas species in the region 16 may have a peak concentration occurring near a projected range of the ions, and the distribution of damage in the region 16 may also exhibit a peak near the projected range. The depth profile within the region 18 includes a distribution of implantation damage, as well as a concentration of the inert gas species that is significantly less than the concentration of the inert gas species in the region 16 and/or that is negligible. The damage imparted to the semiconductor material in region 18 is incidental to the implantation of the inert gas species.

The ion implantation performed to form the regions 16, 18 introduces energetic ions, as indicated diagrammatically by the single-headed arrows, with ion trajectories that penetrate through the dielectric layer 14 and into the semiconductor layer 10. The energetic ions, as they penetrate into the semiconductor layer 10, lose energy via scattering events with atoms and electrons in the semiconductor material of the semiconductor layer 10. Energy lost in nuclear collisions, which dominates at low kinetic energies after energy loss, displaces target atoms of the semiconductor layer 10 from their original lattice sites, which damages the crystal lattice structure of the semiconductor layer 10 and generates point defects in both regions 16, 18. The ions stop in the semiconductor layer 10, and primarily in the region 16 of the semiconductor layer 10, after the kinetic energy is fully dissipated by the energy loss.

The ions may be generated from a suitable source gas and implanted into the semiconductor layer 10 with one or more implantation conditions using an ion implantation tool. The conditions (e.g., ion species, dose, kinetic energy) of the implantation may be selected to tune the characteristics (e.g., depth profile, amount of damage, inert gas content) of the regions 16, 18. The crystal lattice structure of the semiconductor layer 10 in the regions 16, 18 may be damaged relative to its initial single-crystal state by the implanted ions. In an embodiment, the implanted ions may be generated from argon or another type of noble atom gas or inert gas. The ion dose is selected to be less than a threshold dose beyond which recrystallization of the damaged semiconductor material in the regions 16, 18 by a subsequent anneal is not possible. In an embodiment, the ion dose may be less than or equal to $1.3 \times 10^{15}$ cm$^{-2}$. In an embodiment, the ion dose may be greater than $1 \times 10^{14}$ cm$^{-2}$. In an embodiment, the ion dose may be within a range extending from $1 \times 10^{13}$ cm$^{-2}$ to $1 \times 10^{15}$ cm$^{-2}$. In an embodiment, multiple implantations of different kinetic energies and doses may be employed to form the regions 16, 18.

In an embodiment, an area (not shown) of the semiconductor layer 10 may be masked during the implantation forming the regions 16, 18. This area may be used to form, for example, CMOS field-effect transistors for logic devices.

Figure 2:
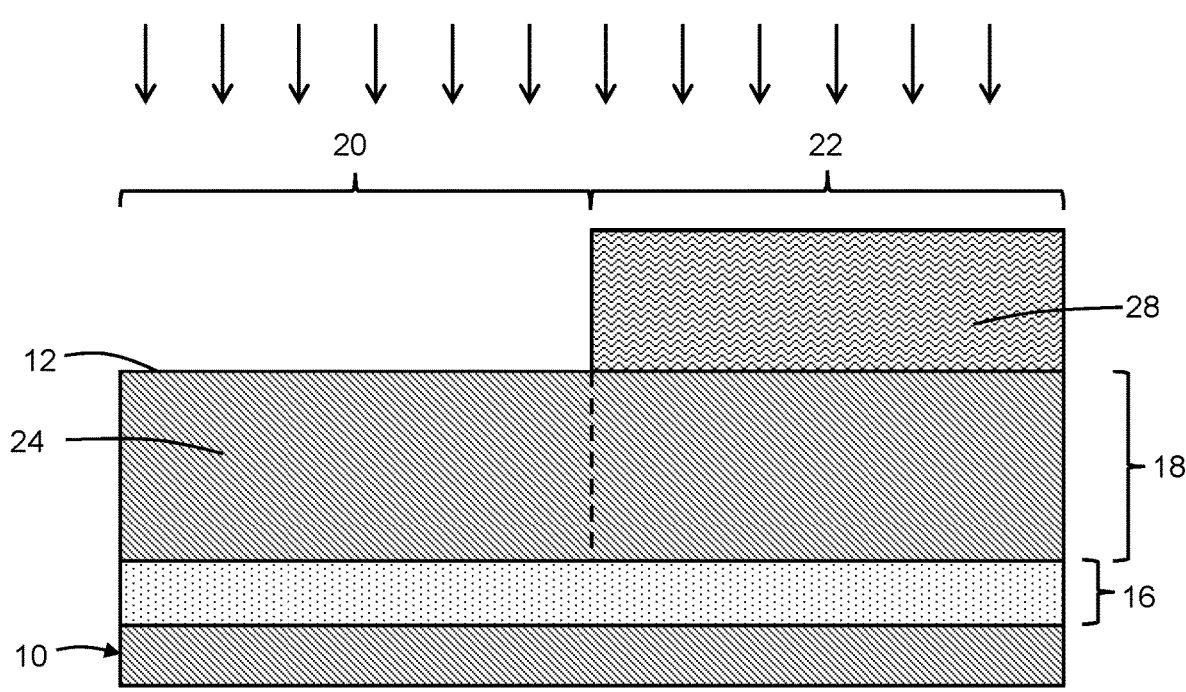

With reference to FIG. 2 in which like reference numerals refer to like features in FIG. 1 and at a subsequent fabrication stage of the processing method, the region 18 in a section 20 of the semiconductor layer 10 may be doped by, for example, ion implantation to form a well 24. To that end, the dielectric layer 14 may be stripped, and an implantation mask 28 may be formed by lithography over a section 22 of the semiconductor layer 10. The implantation mask 28 may include a layer of, for example, an organic photoresist that is applied by a spin coating process, pre-baked, exposed to light projected through a photomask, baked after exposure, and developed with a chemical developer.

After forming the implantation mask 28, the well 24 may be formed in the region 18 within the section 20 of the semiconductor layer 10 by ion implantation with an n-type dopant (e.g., phosphorus and/or arsenic) that provides n-type electrical conductivity. Ion implantation introduces energetic ions, as indicated diagrammatically by the single-headed arrows, with ion trajectories that stop within the semiconductor material of the region 18 in the section 20 of the semiconductor layer 10. The ions may be generated from a suitable source gas and implanted into the region 18 within the section 20 of the semiconductor layer 10 with one or more implantation conditions using an ion implantation tool. The implantation conditions (e.g., ion species, dose, kinetic energy) may be selected to tune the characteristics (e.g., depth profile, amount of damage) of the well 24. In particular, the implantation may introduce additional damage in the region 18 within the section 20 of the semiconductor layer 10 that is additive to the damage prior to the implantation. In an embodiment, multiple implantations of different kinetic energies and doses may be employed to form the well 24. For example, a series of three implantations with different kinetic energies and doses that span the thickness of the region 18 may be employed to form the well 24.

The thickness of the implantation mask 28 is selected such that the ions are stopped in the implantation mask 28 instead of penetrating into the underlying semiconductor layer 10 in the section 22 of the semiconductor layer 10. Following implantation, the implantation mask 28 may be removed by, for example, ashing following implantation.

Figure 3:
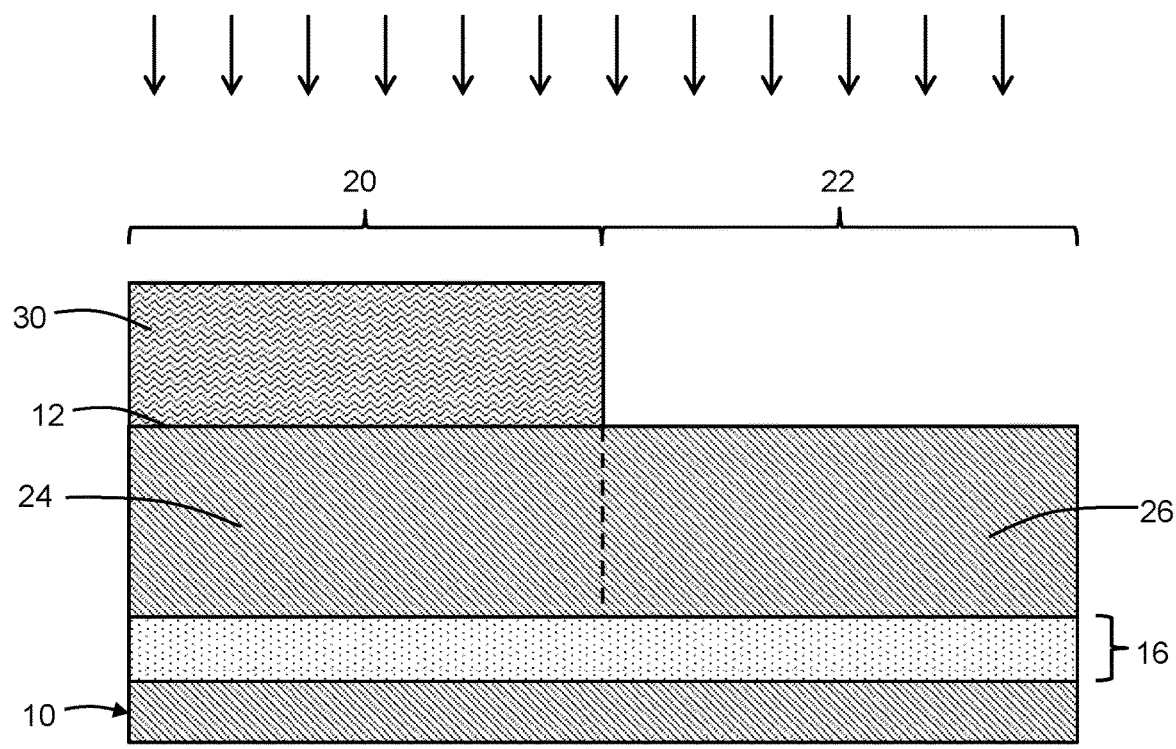

With reference to FIG. 3 in which like reference numerals refer to like features in FIG. 2 and at a subsequent fabrication stage of the processing method, the region 18 within the section 22 of the semiconductor layer 10 may be doped by, for example, ion implantation to form a well 26 having a conductivity type of opposite polarity type to the conductivity type of the well 24. To that end, an implantation mask 30 may be formed by lithography over the section 20 of the semiconductor layer 10. The implantation mask 30 may include a layer of, for example, an organic photoresist that is applied by a spin coating process, pre-baked, exposed to light projected through a photomask, baked after exposure, and developed with a chemical developer.

After forming the implantation mask 30, the well 26 may be formed in the region 18 within the section 22 of the semiconductor layer 10 by ion implantation with a p-type dopant (e.g., boron) that provides p-type electrical conductivity. Ion implantation introduces energetic ions, as indicated diagrammatically by the single-headed arrows, with ion trajectories that stop within the semiconductor material of the region 18 in the section 20 of the semiconductor layer 10. The ions may be generated from a suitable source gas and implanted into the region 18 in the section 22 of the semiconductor layer 10 with one or more implantation conditions using an ion implantation tool. The implantation conditions (e.g., ion species, dose, kinetic energy) may be selected to tune the characteristics (e.g., depth profile, amount of damage) of the well 26. In particular, the implantation may introduce additional damage in the region 18 in the section 22 of the semiconductor layer 10 that is additive to the damage prior to the implantation. In an embodiment, multiple implantations of different kinetic energies and doses may be employed to form the well 26. For example, a series of three implantations with different kinetic energies and doses that span the thickness of the region 18 may be employed to form the well 26.

The thickness of the implantation mask 30 is selected such that the ions being implanted are stopped in the implantation mask 30 instead of penetrating into the underlying semiconductor layer 10 in the section 20 of the semiconductor layer 10. Following implantation, the implantation mask 30 may be removed by, for example, ashing following implantation.

Figure 4:
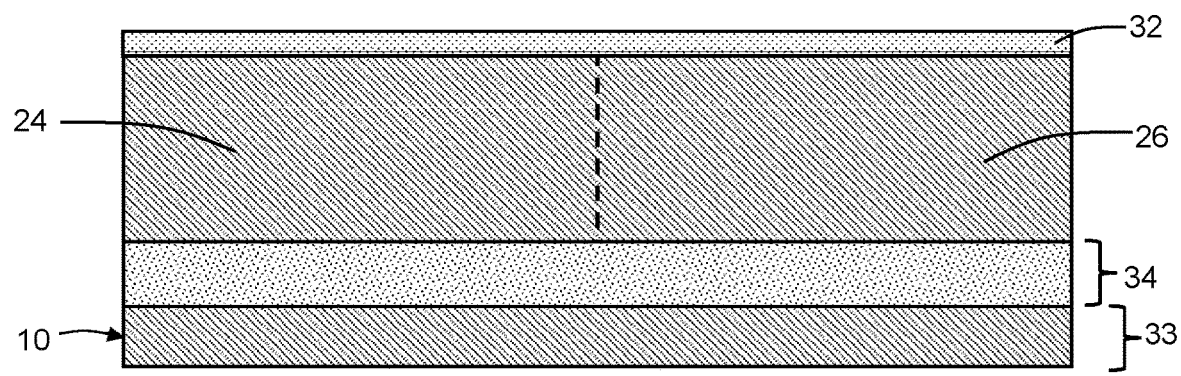

With reference to FIG. 4 in which like reference numerals refer to like features in FIG. 3 and at a subsequent fabrication stage of the processing method, a dielectric layer 32 is formed on the top surface 12 of the semiconductor layer 10 and is arranged over the wells 24, 26. The dielectric layer 32 may be composed of a dielectric material, such as silicon dioxide, deposited by chemical vapor deposition or grown by thermal oxidation. In an alternative embodiment, the wells 24, 26 may be formed with the dielectric layer 14 covering the sections 20, 22 of the semiconductor layer 10 and the dielectric layer 14 may be retained following the formation of the wells 24, 26.

The semiconductor layer 10, and the regions 16, 18 of the semiconductor layer 10 in particular, is subjected to a thermal treatment (i.e., annealing process). In an embodiment, a spike anneal may be performed as the thermal treatment used to thermally treat the regions 16, 18. In an embodiment, the spike anneal may be a rapid thermal anneal (RTA) performed using, for example, a bank of flash lamps that heat the semiconductor layer 10 to a peak temperature in a range of 860° C. to 1125° C. and with a dwell time at the peak temperature of 34 milliseconds to 60 seconds and, in a particular embodiment, the peak temperature may be 1000° C. over a dwell time of 5 seconds.

The thermal treatment recrystallizes the implanted and damaged semiconductor material of the region 16 into a polycrystalline region 34 that contains polycrystalline semiconductor material (e.g., polysilicon). The polycrystalline region 34 also contains defects as residual damage in addition to the grains of the polycrystalline semiconductor material. The defects may contain atoms of the noble gas or inert gas species (e.g., argon) that were implanted to form the region 16. The single-crystal semiconductor material of the semiconductor layer 10, which is arranged in a region 33 below the region 16, provides a crystalline template for recrystallization. The polycrystalline region 34 may be arranged at or near the former location of the peak ion dose and/or peak damage in the semiconductor material of the region 16.

The thermal treatment also recrystallizes the damaged semiconductor material of the wells 24, 26 in the region 18 of the semiconductor layer 10 into monocrystalline or single-crystal semiconductor material (e.g., single-crystal silicon). The single-crystal semiconductor material of the wells 24, 26 is located between the polycrystalline region 34 and the top surface 12 of the semiconductor layer 10. The presence of the dielectric layer 32 may influence the formation of the single-crystal semiconductor material from the damaged semiconductor material of the wells 24, 26 in the region 18 during recrystallization. The thermal treatment may also stabilize and/or activate the dopants introduced into the region 18 to form the wells 24, 26. The region 18 lacks inert gas atoms and defects contained in the polycrystalline region 34, and may has a crystal structure in a monocrystalline state in contrast to the polycrystalline state of the polycrystalline region 34.

Figure 5:
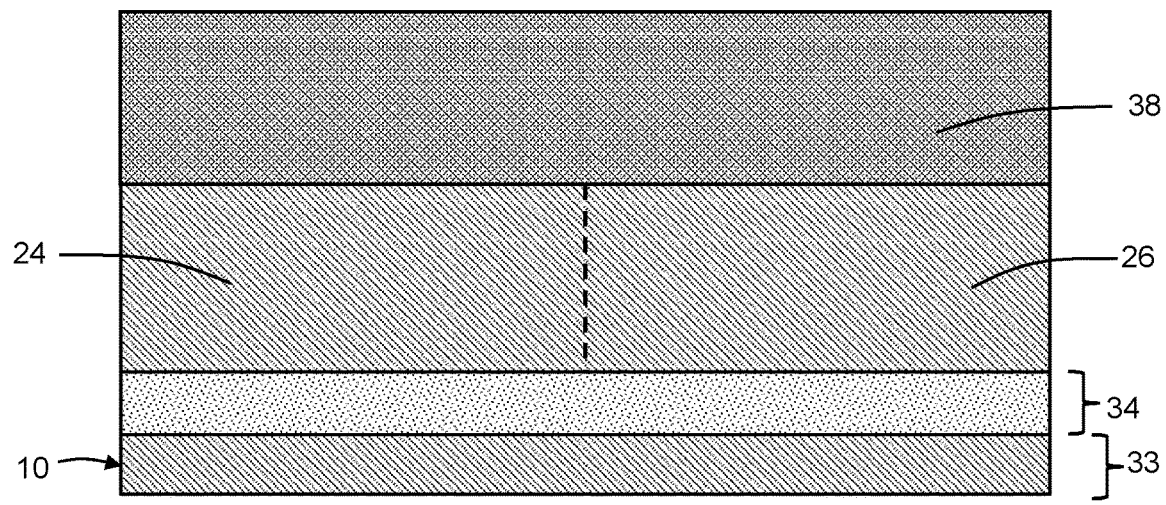

With reference to FIG. 5 in which like reference numerals refer to like features in FIG. 4 and at a subsequent fabrication stage of the processing method, the dielectric layer 32 is stripped, and the top surface 12 of the semiconductor layer 10 may be cleaned in preparation for a subsequent epitaxial growth process. A semiconductor layer 38 is formed on the top surface 12 of the semiconductor layer 10. The semiconductor layer 38 may be grown by an epitaxial growth process using the semiconductor layer 10 as a crystal structure template. The semiconductor layer 38 may be composed of a single-crystal semiconductor material, such as single-crystal silicon. The thickness of the semiconductor layer 38 is chosen to be sufficient for the subsequent formation of fins, and the semiconductor layer 38 may be undoped.

Figure 6:
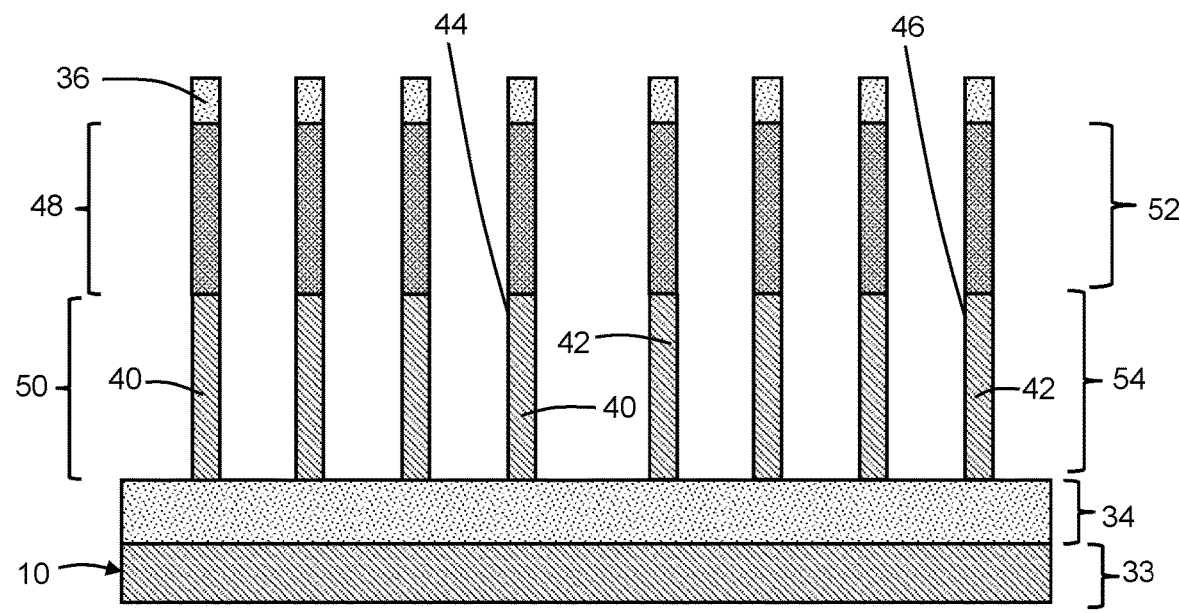

With reference to FIG. 6 in which like reference numerals refer to like features in FIG. 5 and at a subsequent fabrication stage of the processing method, fins 40 are formed from the semiconductor layer 38 and the well 24 in the region 18, and fins 42 are formed from the semiconductor layer 38 and the well 26 in the region 18. The fins 40, 42 may be patterned from the semiconductor materials using a multiple patterning technique, such as self-aligned double patterning (SADP) or self-aligned quadruple patterning (SAQP). In an embodiment, the fins 40, 42 are concurrently patterned, and each of the fins 40, 42 may be covered by sections of a hardmask 36 employed during patterning. The polycrystalline region 34 extends laterally as a continuous layer beneath all of the fins 40, 42.

Each of the fins 40 has side surfaces or sidewalls 44 and a top surface covered by one of the sections of the hardmask 36, and each of the fins 42 has side surfaces or sidewalls 46 and a top surface covered by one of the sections of the hardmask 36. In an embodiment, the wells 24, 26 are fully patterned, and the sidewalls 44 of the fins 40 and the sidewalls 46 of the fins 42 may extend to the polycrystalline region 34. Each of the fins 40 includes an upper section 48 composed of the semiconductor material of the semiconductor layer 38 and a lower section 50 composed of the doped semiconductor material of the well 24. Each of the fins 42 includes an upper section 52 composed of the semiconductor material of the semiconductor layer 38 and a lower section 54 composed of the doped semiconductor material of the well 26. The lower sections 50 of the fins 40 and the lower sections 54 of the fins 42 therefore are characterized by different conductivity types of opposite polarity. The respective lower sections 50, 54 of the fins 40, 42 may provide punch-through stopper (PTS) layers or structures that function to suppress sub-channel leakage currents during device operation.

Figure 7:
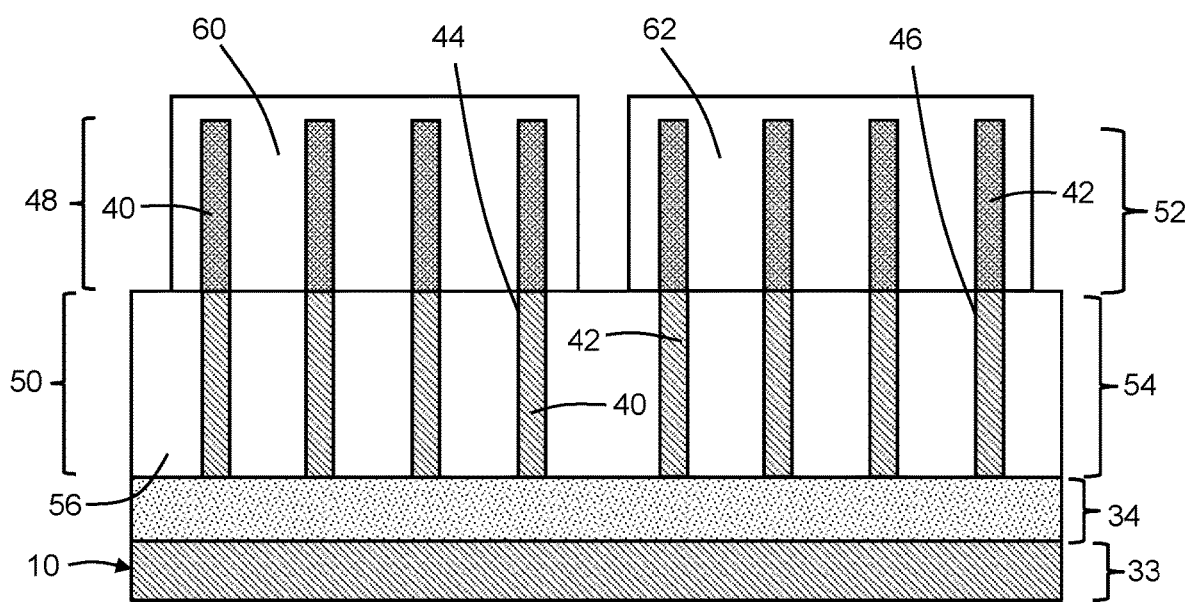

With reference to FIG. 7 in which like reference numerals refer to like features in FIG. 6 and at a subsequent fabrication stage of the processing method, a dielectric layer 56 is arranged to surround and bury the respective lower sections of the fins 40, 42. The respective upper sections 48 of the fins 40 and the upper sections 52 of the fins 42 may be arranged above a top surface of the dielectric layer 56. In an embodiment, the top surface of the dielectric layer 56 may be coplanar with the interface between the upper and lower sections 48, 50 of the fins 40 and also coplanar with the interface between the upper and lower sections 52, 54 of the fins 42. The dielectric layer 56 may be composed of a dielectric material, such as silicon dioxide, deposited by chemical vapor deposition. Subsequent to deposition, the dielectric layer 56 may be polished with chemical-mechanical polishing and recessed with an etching process to reveal the upper sections 48 of the fins 40 and the upper sections 52 of the fins 42. The sections of the hardmask 36 over the top surfaces of the fins 40 and over the top surfaces of the fins 42 may be removed after the dielectric layer 56 is recessed.

A gate structure 60 of a field-effect transistor is formed that extends transversely across the fins 40, and a gate structure 62 of a different field-effect transistor is formed that extends transversely across the fins 42. The gate structures 60, 62 have an overlapping relationship with the fins 40, 42, and in particular, have an overlapping relationship with respective channel regions in the upper sections 48, 52 of the fins 40, 42. The gate structures 60, 62 may include a gate electrode and a gate dielectric formed by depositing a layer stack and patterning the layer stack with photolithography and etching. The gate electrode may be composed of a conductor, such as doped polycrystalline silicon (i.e., polysilicon) or a work function metal, and the gate dielectric may be composed of an electrical insulator, such as silicon dioxide or hafnium oxide.

The polycrystalline region 34 may improve the performance of devices in a radio-frequency operating mode by acting as an isolation layer between the active devices (e.g., the fin-type field-effect transistors) and the bulk substrate portion of the semiconductor layer 10 beneath the polycrystalline region 34. The fin-type field-effect transistors formed using the fins 40, 42 may be used in, for example, a switch or a low-noise amplifier, which have a performance that benefits from the electrical isolation provided by the polycrystalline region 34. In addition, the polycrystalline region 34 under the fin-type field-effect transistors effectively increases the substrate resistance and, for that reason, reduces the sub-channel leakage to the bulk substrate portion of the semiconductor layer 10.

Figure 8:
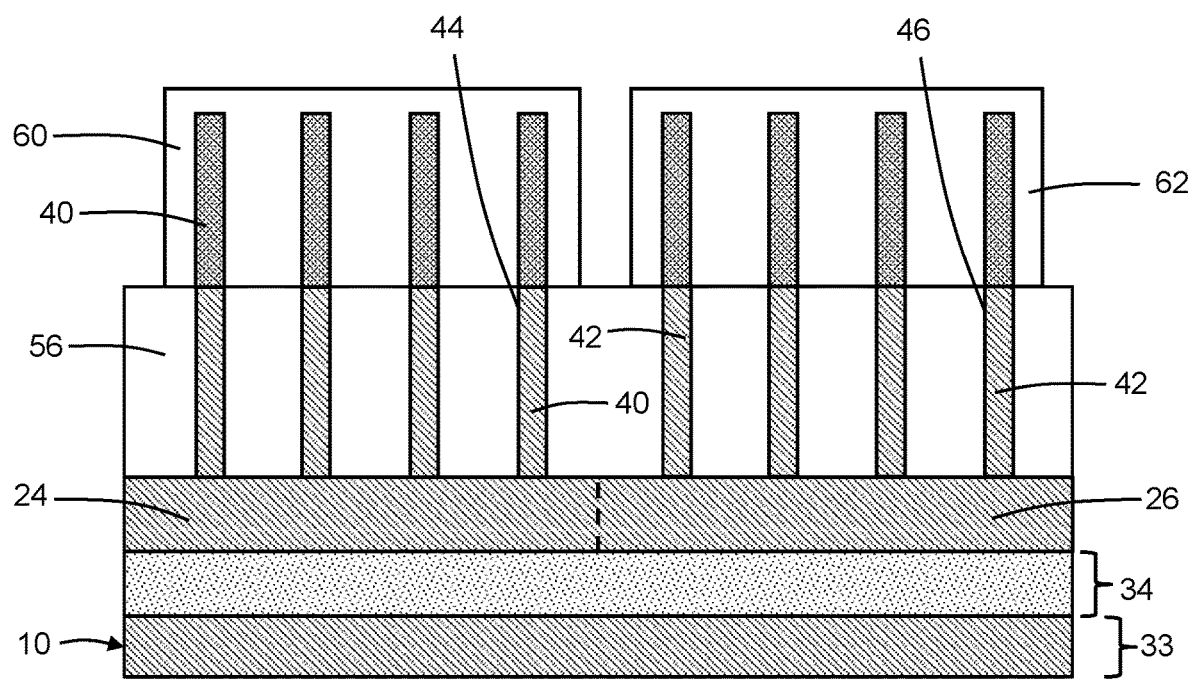
FIGS. 8 and 9 are cross-sectional views of structures in accordance with alternative embodiments of the invention.

With reference to FIG. 8 in which like reference numerals refer to like features in FIG. 7 and in accordance with alternative embodiments, the wells 24, 26 may be rearranged in depth and the patterning of the fins 40, 42 may be modified such that an intact section of the well 24 is arranged between the lower sections 50 of the fins 40 and the polycrystalline region 34 and an intact section of the well 26 is arranged between the lower sections 54 of the fins 42 and the polycrystalline region 34.

Figure 9:
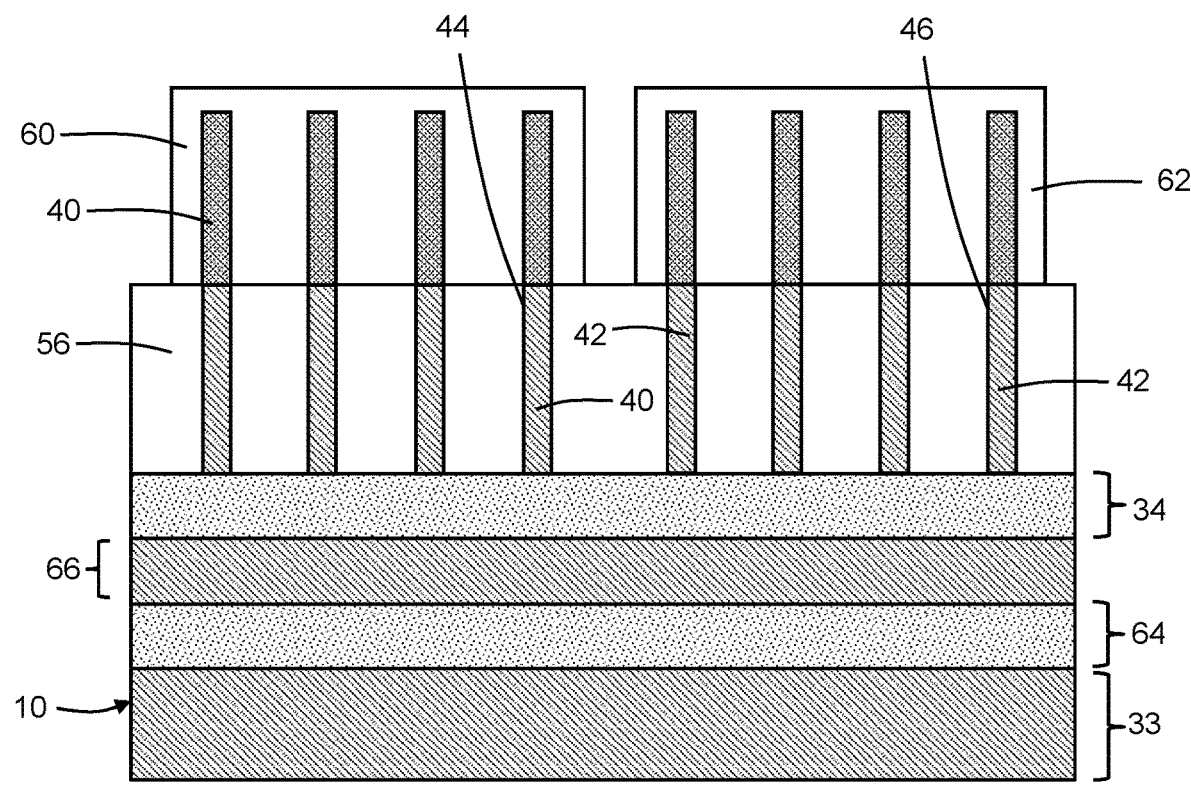

With reference to FIG. 9 in which like reference numerals refer to like features in FIG. 7 and in accordance with alternative embodiments of the invention, an additional region similar to region 16 may be formed by ion implantation in the semiconductor layer 10 at a location below the region 16. This added region containing damage and inert gas atoms may be converted into an additional polycrystalline region 64 that is similar to the polycrystalline region 34 such that multiple polycrystalline regions 34, 64 are present in respective discrete layers beneath all of the fins 40, 42. The polycrystalline region 64 may be composed of polycrystalline semiconductor material (e.g., polysilicon) that contains defects as residual damage, in addition to the grains of the polycrystalline semiconductor material and inert gas atoms associated with the defects. A region 66 of single-crystal or monocrystalline semiconductor material, similar to the monocrystalline semiconductor material in region 18 following the thermal treatment, may be arranged between the polycrystalline region 34 and the polycrystalline region 64.

In general, multiple polycrystalline layers or regions may be formed in the semiconductor layer 10 and adjacent polycrystalline layers or regions may be separated by an intervening layer or region of single-crystal semiconductor material. The number of polycrystalline regions may be controlled by the number of implants and/or the energy and ion dose of the implants, which determine at least in part the ability of the implantation-damaged semiconductor material to recrystallize into polycrystalline semiconductor material during annealing. For example, multiple separate implants may be utilized to form the multiple polycrystalline regions. As another example, a single implant may also lead to the formation of multiple polycrystalline layers depending on the energy and ion dose. Recrystallization may concurrently proceed upwardly from the portion of the semiconductor layer 10 beneath each damaged region and downwardly from the portion of the semiconductor layer 10 over each damaged region.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a semiconductor layer including a first polycrystalline layer, a second polycrystalline layer, and a first region of single-crystal semiconductor material between the first polycrystalline layer and the second polycrystalline layer, the semiconductor layer comprised of a second region of single-crystal semiconductor material below the second polycrystalline layer, and the first polycrystalline layer and the second polycrystalline layer comprised of polycrystalline semiconductor material; and
    a first fin-type field-effect transistor including a first plurality of fins over the first polycrystalline layer, each of the first plurality of fins comprised of single-crystal semiconductor material, the first plurality of fins having respective sidewalls that fully extend to the first polycrystalline layer, each of the first plurality of fins having a first section and a second section located between the first section and the first polycrystalline layer, and the second section of each of the first plurality of fins containing a first dopant having a first conductivity type,
    wherein the first polycrystalline layer and the first region of single-crystal semiconductor material are located between the second polycrystalline layer and the first plurality of fins.

2. The structure of claim 1 wherein the first section of each of the first plurality of fins is undoped.

3. The structure of claim 1 further comprising:
    a second fin-type field-effect transistor including a second plurality of fins located over the first polycrystalline layer,
    wherein each of the second plurality of fins has a first section and a second section located between the first section and the first polycrystalline layer, and the second section of each of the second plurality of fins contains a second dopant with a second conductivity type having an opposite polarity to the first conductivity type.

4. The structure of claim 3 further comprising:
a first well located in the semiconductor layer between the first polycrystalline layer and the first plurality of fins, the first well containing the first dopant; and
a second well located in the semiconductor layer between the first polycrystalline layer and the second plurality of fins, the second well containing the second dopant.

5. The structure of claim 1 wherein the first fin-type field-effect transistor further includes a gate structure having an overlapping relationship with the first plurality of fins.

6. The structure of claim 1 wherein the first polycrystalline layer contains grains of the polycrystalline semiconductor material, defects, and atoms of a noble gas species.

7. The structure of claim 1 wherein the first polycrystalline layer and the second polycrystalline layer contain atoms of a noble gas species.

8. The structure of claim 6 wherein the second polycrystalline layer contains grains of the polycrystalline semiconductor material, defects, and atoms of a noble gas species.

9. A structure comprising:
a semiconductor layer including a first polycrystalline layer, a second polycrystalline layer, and a first region of single-crystal semiconductor material between the first polycrystalline layer and the second polycrystalline layer, the semiconductor layer comprised of a second region of single-crystal semiconductor material below the second polycrystalline layer, and the first polycrystalline layer and the second polycrystalline layer comprised of polycrystalline semiconductor material; and
a fin-type field-effect transistor including a plurality of fins over the first polycrystalline layer, each of the plurality of fins comprised of single-crystal semiconductor material; and
a well located between the first polycrystalline layer and the plurality of fins,
wherein the first polycrystalline layer and the first region of single-crystal semiconductor material are located between the second polycrystalline layer and the plurality of fins.

10. The structure of claim 9 wherein each of the plurality of fins has a first section and a second section, the second section is directly over the well, and the second section of each of the plurality of fins and the well contain a dopant.

11. The structure of claim 10 wherein the first section of each of the plurality of fins is undoped.

12. The structure of claim 9 wherein the first polycrystalline layer contains grains of the polycrystalline semiconductor material, defects, and atoms of a noble gas species.

13. The structure of claim 9 wherein the first polycrystalline layer and the second polycrystalline layer contain atoms of a noble gas species.

14. The structure of claim 12 wherein the second polycrystalline layer contains grains of the polycrystalline semiconductor material, defects, and atoms of a noble gas species.

15. A method comprising:
forming a semiconductor layer including a first polycrystalline layer and a second polycrystalline layer, wherein the first polycrystalline layer and the second polycrystalline layer are comprised of polycrystalline semiconductor material, the semiconductor layer is comprised of a first region of single-crystal semiconductor material between the first polycrystalline layer and the second polycrystalline layer, and the semiconductor layer is comprised of a second region of single-crystal semiconductor material below the second polycrystalline layer; and
forming a first fin-type field-effect transistor including a first plurality of fins located over the first polycrystalline layer,
wherein each of the first plurality of fins is comprised of single-crystal semiconductor material, the first plurality of fins have respective sidewalls that fully extend to the first polycrystalline layer, each of the first plurality of fins has a first section and a second section located between the first section and the first polycrystalline layer, the second section of each of the first plurality of fins contains a first dopant having a first conductivity type, and the first polycrystalline layer and the first region of single-crystal semiconductor material are located between the second polycrystalline layer and the first plurality of fins.

16. The method of claim 15 wherein forming the semiconductor layer including the first polycrystalline layer and the second polycrystalline layer comprises:
implanting the semiconductor layer over a depth range with ions of a noble gas species; and
annealing the semiconductor layer to convert a portion of the semiconductor layer within the depth range to the polycrystalline semiconductor material.

17. The method of claim 15 wherein a second plurality of fins are located over the first polycrystalline layer, each of the second plurality of fins has a first section and a second section located between the first section and the first polycrystalline layer, and the second section of each of the second plurality of fins contains a second dopant having a second conductivity type of opposite polarity to the first conductivity type.

18. The method of claim 16 further comprising:
implanting the semiconductor layer with ions of the first dopant.

19. The method of claim 18 wherein the first plurality of fins are formed by growing epitaxial semiconductor material on the semiconductor layer, and patterning the epitaxial semiconductor material to form the first section of each of the first plurality of fins and the semiconductor layer to form the second section of each of the first plurality of fins.

\* \* \* \* \*